United States Patent [19]
Pressey et al.

[11] Patent Number: 5,751,769
[45] Date of Patent: May 12, 1998

[54] PROGRAMMABLE DIGITAL LINEAR AND NONLINEAR TRANSVERSAL EQUALIZER

[75] Inventors: James Pressey, San Jose; Richard Koralek, Palo Alto; Francis J. Smith, Livermore, all of Calif.

[73] Assignee: Lockheed Martin Aerospace Corp., Bethesda, Md.

[21] Appl. No.: 734,879

[22] Filed: Oct. 22, 1996

[51] Int. Cl.$^6$ .............................. H03H 7/30; H03K 5/139
[52] U.S. Cl. ............................................. 375/235; 375/232
[58] Field of Search ................................ 375/229, 230, 375/232, 235; 364/724.19, 724.2, 825; 333/18

[56] References Cited

U.S. PATENT DOCUMENTS

| | | | |
|---|---|---|---|
| 4,792,915 | 12/1988 | Adams et al. | 364/724.19 |
| 5,146,494 | 9/1992 | Harman | 364/724.19 |
| 5,148,427 | 9/1992 | Buttle et al. | 370/291 |
| 5,329,586 | 7/1994 | Agazzi | 364/724.2 |

*Primary Examiner*—Stephen Chin
*Assistant Examiner*—Betsy L. Deppe
*Attorney, Agent, or Firm*—Kenneth W. Float

[57] ABSTRACT

An equalizer that mitigates both linear and nonlinear distortions for amplitude phase keyed signals that are processed thereby. Algorithms employed in the equalizer are based on correcting received signals based on symbol transitions between successive symbols. The linear portion of the equalizer is programmable and can use any available algorithm. Programmable linear taps of the equalizer may be programmed in a nonlinear manner by using the lookup tables as amplitude dependent equalizers that are used to process one symbol at a time. In the equalizer, each amplitude level has it's own correction factor by using amplitude dependent coefficients. The equalizer can implement both linear and nonlinear equalization. Equalizer corrections are implemented using predetermined values stored in lookup tables. The equalization corrections are determined in an external computer and are loaded into the lookup tables for each amplitude level of the received signals. The equalizer is programmable and may be used with any amplitude phase keyed signal by reprogramming the lookup tables from the external computer for the desired modulation.

10 Claims, 2 Drawing Sheets

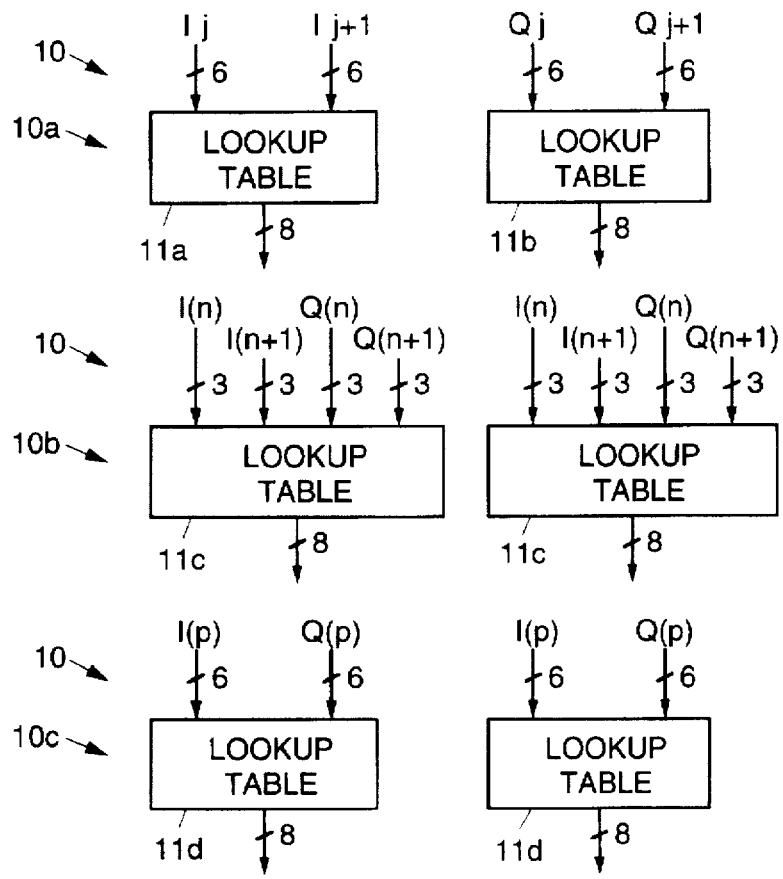
Fig. 1a
Fig. 1b
Fig. 1c
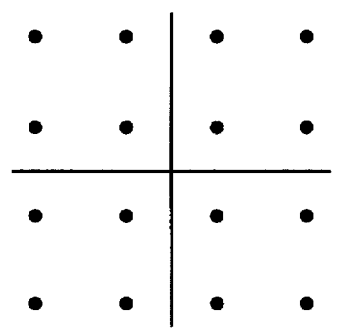
Fig. 3a
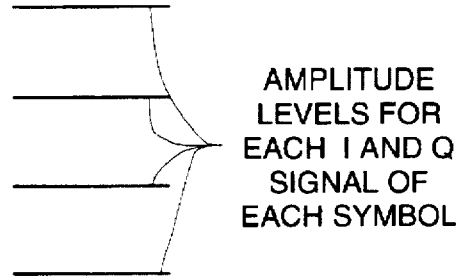
AMPLITUDE LEVELS FOR EACH I AND Q SIGNAL OF EACH SYMBOL
Fig. 3b
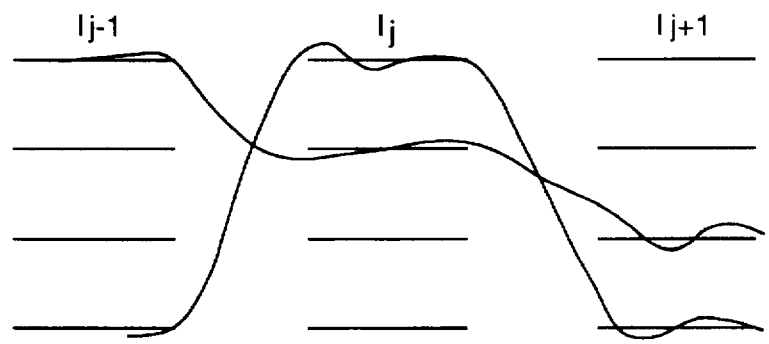
Fig. 3c

PROGRAMMABLE DIGITAL LINEAR AND NONLINEAR TRANSVERSAL EQUALIZER

BACKGROUND

The present invention relates generally to programmable equalizers, and more particularly, to a programmable digital linear and nonlinear transversal equalizer.

When digitally modulated communications signals are transmitted through nonlinear channels that exhibit both linear and nonlinear distortions, the degradation to the receive signal can be severe. The standard practice of using a linear adaptive finite impulse response (FIR) filter (linear transversal equalizer) with either a zero forcing or a least mean square algorithm is limited by the inability of the linear equalizer to mitigate nonlinear distortion.

Technical papers have been published that analyze and simulate nonlinear equalizers. Most of these nonlinear equalizers are based on a Voltera series. To the knowledge of the inventors, to date, no one has built working hardware that implement nonlinear programmable equalizers. Conventional linear transversal equalizers make corrections based on only one symbol at a time. The coefficients may be chosen (during training) based upon multiple symbols. Once trained, each component of the correction term is a function of only one symbol amplitude and one coefficient. In conventional linear equalizers, all symbol amplitude values for a given tap are multiplied by a single coefficient.

Therefore, it is an objective of the present invention to provide a programmable digital linear and nonlinear transversal equalizer. It is another objective of the present invention to provide a programmable digital linear and nonlinear transversal equalizer that mitigates linear and nonlinear distortions for amplitude phase keyed signals.

SUMMARY OF THE INVENTION

To meet the above and other objectives, the present invention provides for a programmable digital linear and nonlinear transversal equalizer that mitigates both linear and nonlinear distortions for amplitude phase keyed signals that are processed thereby. The equalizer comprises in-phase (I) and quadrature (Q) delay circuits that each have a predetermined number of delay elements that respectively delay phase (I) and quadrature (Q) input data by a predetermined delay time. An in-phase through dual tap nonlinear lookup table circuit, having a predetermined number of first in-phase nonlinear lookup tables, is coupled to receive the delayed values of the in-phase data inputs. A quadrature through dual tap nonlinear lookup table circuit, having a predetermined number of first quadrature nonlinear lookup tables, is coupled to receive the delayed values of the quadrature data inputs. An in-phase to quadrature cross dual tap nonlinear lookup table circuit, having a predetermined number of first in-phase nonlinear lookup tables, is coupled to receive the delayed values of the in-phase data inputs. An quadrature to in-phase cross dual tap nonlinear lookup table circuit, having a predetermined number first in-phase nonlinear lookup tables, is coupled to receive the delayed values of the quadrature data inputs. First and second I/Q cross product nonlinear lookup table circuits are coupled to receive the delayed values of the I and Q data inputs provided by the in-phase and quadrature delay circuits.

A first adder is coupled to receive the outputs of the in-phase through dual tap nonlinear lookup table circuit, the outputs of the quadrature to in-phase cross dual tap nonlinear lookup table circuit, and the outputs of the first I/Q cross product nonlinear lookup table circuits. A first selection circuit is coupled to receive respective delayed values of the in-phase data inputs derived from the delay circuit and has a select output coupled to the first adder. A second adder is coupled to receive the outputs of the quadrature through dual tap nonlinear lookup table circuit, the outputs of in-phase to quadrature cross dual tap nonlinear lookup table circuit and the outputs of the second I/Q cross product nonlinear lookup table circuit. A second selection circuit is coupled to receive respective delayed values of the quadrature data inputs derived from the delay circuit that has a select output coupled to the second adder. The adders output filtered I and Q data, respectively, from the equalizer.

The algorithms employed in the equalizer are based on correcting received signals based on symbol transitions between successive symbols. The linear portion of the equalizer is also programmable and can use any available algorithm. The programmable linear taps of the equalizer may be programmed in a nonlinear manner by using the lookup tables as amplitude dependent equalizers that are used to process one symbol at a time. In contrast to conventional linear equalizers, each amplitude level has it's own correction factor.

The equalizer has both linear and nonlinear equalization capability. Equalizer corrections are implemented using predetermined values stored in the lookup tables. The equalization corrections are determined in an external computer and are loaded into the lookup tables for each amplitude level of the received signals. Since the equalizer is programmable, it can be used for any amplitude phase keyed signal, for example, by simply reprogramming the lookup tables from the computer for the desired modulation. This provides the capability for a single modem to support any amplitude phase keyed signal equalization with linear and nonlinear corrections.

The specific nonlinear equalizers of the present invention make corrections based on numerous symbols at a time, or based on the transitions between multiple symbols. These algorithms are not based on a Voltera series, but rather on the anticipated distortion induced by unique transitions between symbols.

The equalizer is programmable for a wide range of amplitude phase keyed signals from QPSK to 256 QAM for any arbitrary amplitude phase keyed signal. The present equalizer provides capability to concurrently perform linear and nonlinear equalization, such as linear equalization followed by nonlinear equalization, and nonlinear equalization followed by linear equalization. The present equalizer provides for amplitude dependent symbol by symbol correction. The present equalizer has a programmable hardware architecture that allows for new equalization algorithms to be implemented without requiring hardware changes.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIGS. 1a–1c illustrate three different types of nonlinear lookup tables employing multi-symbol nonlinear tap configurations that are employed in the present invention;

FIGS. 3a–3c provides an example illustrating the concept of the present invention for 16 QAM signals.

DETAILED DESCRIPTION

Figure 2:
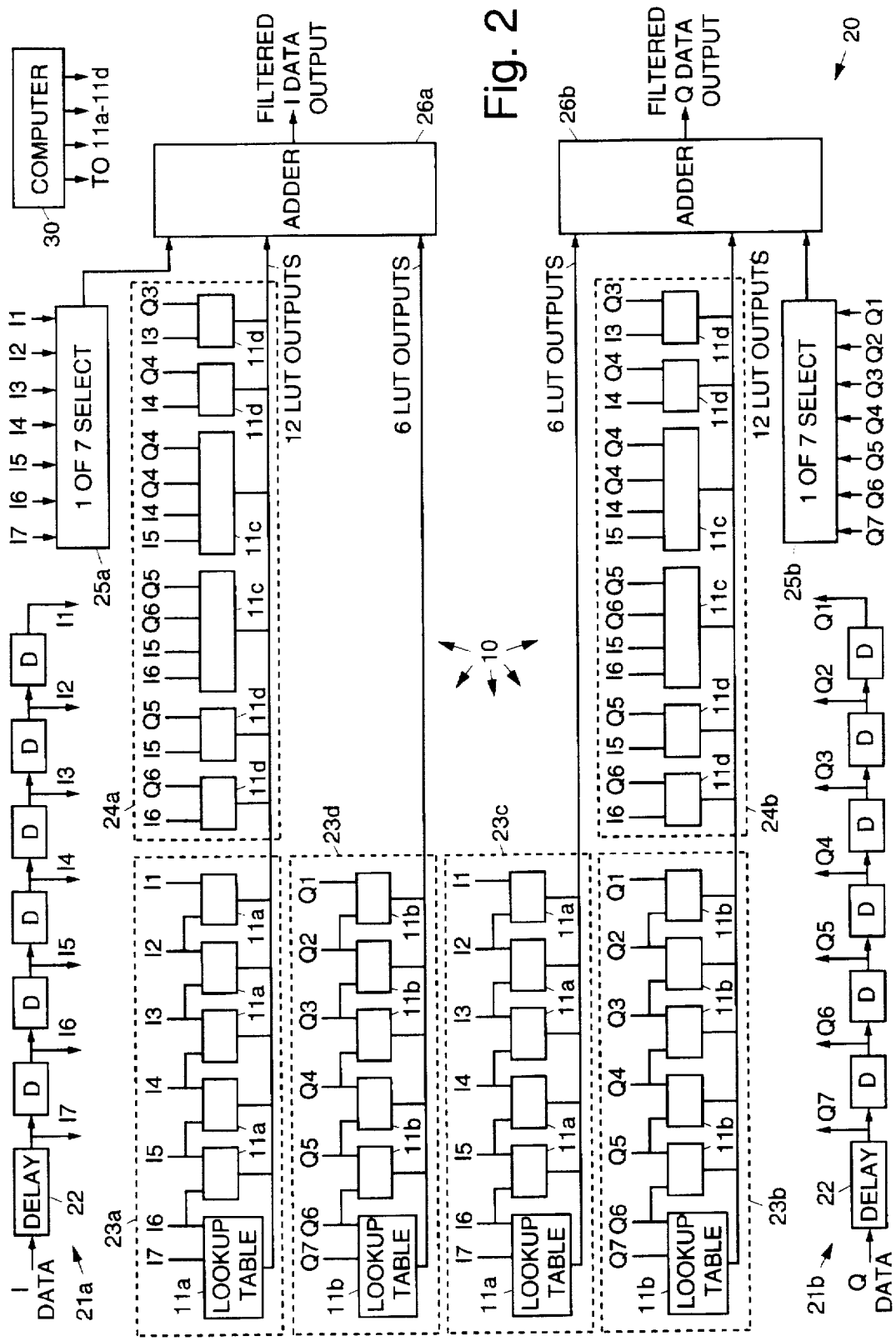
FIG. 2 illustrates a programmable digital linear and nonlinear transversal equalizer in accordance with the principles of the present invention.

Referring to the drawing figures, FIGS. 1a–1c illustrate three different types of nonlinear lookup tables 10 employing multi-symbol nonlinear tap configurations that are employed in the present invention. Referring to FIG. 1a, it shows a first set of nonlinear lookup tables 10a comprising first in-phase (I) and quadrature (Q) nonlinear lookup tables 11a, 11b. The first in-phase nonlinear lookup table 11a has two adjacent taps I(j), I(j+1) that address the in-phase lookup tables 11a for through and cross data paths. The first quadrature nonlinear lookup table 11b has two adjacent taps Q(j), Q(j+1) that address the quadrature lookup table 11b for the through and cross data paths. The first in-phase nonlinear lookup table 1a receives a six bit representation of the amplitude of the I(j) and I(j+1) symbols, which is a digital measure of the amplitude of the symbol. The output of the first in-phase nonlinear lookup table 11a for the through data path is an eight bit representation of the amplitude of the correction to be added or subtracted from the symbol on which correction is being applied. This is substantially the same as in a conventional equalizer tap except that the correction is based on two symbols rather than one as in a linear equalizer. Similarly, the first quadrature nonlinear lookup table 11b for the cross data path receives a six bit representation of the amplitude of the Q(j) and Q(j+1), and outputs an eight bit representation of the amplitude of the correction to be added or subtracted from the symbol on which correction is being applied.

FIG. 1b shows a second set of nonlinear lookup tables 10b comprising second combined in-phase and quadrature nonlinear lookup tables 11c. The second combined in-phase and quadrature nonlinear lookup tables 11c each have two adjacent in-phase taps I(n), I(n+1) and two adjacent quadrature taps Q(n), Q(n+1) that address the combined in-phase and quadrature lookup table 11c for the through and cross data paths. Each of the second combined in-phase and quadrature nonlinear lookup tables 11c receive four inputs corresponding to I(n), I(n+1), Q(n), and Q(n+1) and output eight bit signals for the through and cross data paths.

FIG. 1c shows a third set of nonlinear lookup tables 10c comprising third combined in-phase and quadrature nonlinear lookup tables 11d. The third combined in-phase and quadrature nonlinear lookup table 11d each have in-phase and quadrature taps I(p) and Q(p) that respectively address the third combined in-phase and quadrature lookup tables 11d for the through and cross data paths. Each of the third combined in-phase and quadrature nonlinear lookup tables 11d receive six bit inputs corresponding to I(p) and Q(p) and output eight bit signals for the through and cross data paths. Each of the types of nonlinear lookup tables 10 shown in FIGS. 1a–1c are used in the architecture of the present invention.

Referring to FIG. 2, it depicts a programmable digital linear and nonlinear transversal equalizer 20 in accordance with the principles of the present invention employing the above-described nonlinear lookup tables 10. The equalizer 20 comprises in-phase and quadrature delay circuits 21a, 21b that each include seven delay elements 22 that respectively delay in-phase and Q input data by a predetermined delay time. The in-phase delay circuit 21a provides seven tapped delayed output signals (I7–I1) corresponding to delayed values of the I data input thereto. Similarly, the quadrature delay circuit 21b provides seven tapped delayed output signals (Q7–Q1) corresponding to delayed values of the Q data input thereto.

The delayed values of the I data inputs are coupled to an in-phase through dual tap programmable nonlinear lookup table circuit 23a comprising six first in-phase nonlinear lookup tables 11a. The delayed values of the Q data inputs are coupled to a quadrature through dual tap programmable nonlinear lookup table circuit 23b comprising six first quadrature nonlinear lookup tables 11b. The delayed values of the I data inputs are also coupled to an in-phase to quadrature cross dual tap nonlinear lookup table circuit 23c comprising six first in-phase nonlinear lookup tables 11a. Similarly, the delayed values of the Q data inputs are coupled to an quadrature to in-phase cross dual tap programmable nonlinear lookup table circuit 23d comprising six first in-phase nonlinear lookup tables 11a.

The delayed values of the I and Q data inputs provided by the in-phase and quadrature delay circuits 21a, 21b are coupled to first and second I/Q cross product programmable nonlinear lookup table circuits 24a, 24b. The first and second I/Q cross product programmable nonlinear lookup table circuits 24a, 24b each comprise two second combined in-phase and quadrature nonlinear lookup tables 11c and four third combined in-phase and quadrature nonlinear lookup tables 11d.

The outputs of the in-phase through dual tap programmable nonlinear lookup table circuit 23a, the outputs of quadrature to in-phase cross dual tap programmable nonlinear lookup table circuit 23d, and the outputs of the first I/Q cross product programmable nonlinear lookup table circuits 24a are coupled to a first adder 26a. Respective delayed values of the I data inputs derived from the delay circuit 21a are coupled to a first selection circuit 25a (comprising a first one-of-seven selection circuit 25a) whose select output is coupled to the first adder 26a. Similarly, the outputs of the quadrature through dual tap programmable nonlinear lookup table circuit 23b, the outputs of in-phase to quadrature cross dual tap programmable nonlinear lookup table circuit 23c and the outputs of the second I/Q cross product programmable nonlinear lookup table circuit 24b are coupled to a second adder 26b. Respective delayed values of the Q data inputs derived from the delay circuit 21b are coupled to a second selection circuit 25b (comprising a one-of-seven second selection circuit 25b) whose select output is coupled to the second adder 26b. The respective adders 26a, 26b output filtered I and Q data from the equalizer 20.

The linear portion of the present equalizer 20 is implemented with programmable lookup tables 11a, 11b, 11c, 11d in the manner shown in FIG. 2. The digitized I and Q values of the input signal are quantized to 8 bits in the respective programmable lookup tables 11a, 11b, 11c, 11d and the pre-multiplied corrections are loaded by means of an external computer 30 into the 256 memory locations of each lookup table 11a, 11b, 11c, 11d corresponding to the signal input levels.

The programmable multi-tap non-linear equalizer 20 is constructed with three types of non-linear taps, and these tap configurations are shown in FIGS. 1a–1c. The overall equalizer architecture is shown in FIG. 2. The proof of concept equalizer 20 shown in FIG. 2 was constructed and tested. The architecture of the equalizer 20 shown in FIG. 2 has the capability to perform either linear or nonlinear equalization first.

The initial development of the equalizer 20 was to develop a simple two tap equalizer 20 with four bits of input quantization. However, the design was enhanced to provide for a multi-tap equalizer 20 with several types of taps as shown in FIGS. 1a–1c and 2. The initial concept and hardware only allowed for linear equalization concurrent with nonlinear equalization. Concurrent equalization means that both the linear and nonlinear equalizers operate in parallel on a fully distorted and nonequalized signal. In the enhanced configuration described herein, the capability for the signal to be linearly equalized and then nonlinearly equalized is provided. The capability to perform nonlinear equalization followed by linear equalization is also provided by the equalizer 20.

To more fully understand the present invention, an example based on equalizing 16 QAM signals is provided below. The example shown in FIGS. 3a–3c is intentionally simple to illustrate the concept of the present invention, because, in the actual hardware, there are many configuration of tap pairs for which the correction are determined as shown in FIG. 2. The concept of providing equalization based on two symbols is that the distortions between different symbols is often different. FIGS. 3a–3c provide an example illustrating the concept of the present invention for 16 QAM signals.

FIG. 3a shows QAM signal transitions for each of the I and Q signals for each symbol transition. As shown in FIG. 3b, for each symbol there are four possible amplitude levels for each I and Q signal. As is illustrated in FIG. 3c, the distortions are unique to the combination of symbols. Thus, symbol "A" followed by symbol "B" may have a different distortion than symbol "B" followed by symbol "A" or symbol "C", for example. The present nonlinear transversal equalizer 20 makes corrections based on two symbol combination, not one as in a linear equalizer. When a linear LMS equalizer is converged, it is assumed that for a given amplitude of a given symbol, the correction will always be the same. This is not true in a nonlinear system.

Thus, a programmable digital linear and nonlinear transversal equalizer has been disclosed. It is to be understood that the described embodiments are merely illustrative of some of the many specific embodiments which represent applications of the principles of the present invention. Clearly, numerous and other arrangements can be readily devised by those skilled in the art without departing from the scope of the invention.

What is claimed is:

1. A programmable digital linear and nonlinear transversal equalizer comprising:

in-phase and quadrature delay circuits that each include a predetermined number of delay elements that respectively delay in-phase (I) and quadrature (Q) input data by a predetermined delay time;

an in-phase through dual tap nonlinear lookup table circuit comprising a predetermined number of first in-phase nonlinear lookup tables coupled to receive the delayed values of the I data inputs;

a quadrature through dual tap nonlinear lookup table circuit comprising a predetermined number of first quadrature nonlinear lookup tables coupled to receive the delayed values of the Q data inputs;

an in-phase to quadrature cross dual tap nonlinear lookup table circuit comprising a predetermined number of first in-phase nonlinear lookup tables coupled to receive the delayed values of the I data inputs;

a quadrature to in-phase cross dual tap nonlinear lookup table circuit comprising a predetermined number of first in-phase nonlinear lookup tables coupled to receive the delayed values of the Q data inputs;

first and second I/Q cross product nonlinear lookup table circuits that are each coupled to receive the delayed values of the I and Q data inputs provided by the in-phase and quadrature delay circuits;

a first adder coupled to receive the outputs of the in-phase through dual tap nonlinear lookup table circuit, the outputs of quadrature to in-phase cross dual tap nonlinear lookup table circuit, and the outputs of the first I/Q cross product nonlinear lookup table circuits;

a first selection circuit coupled to receive respective delayed values of the I data inputs output by the delay circuit that has a select output coupled to the first adder;

a second adder coupled to receive the outputs of the quadrature through dual tap nonlinear lookup table circuit, the outputs of in-phase to quadrature cross dual tap nonlinear lookup table circuit and the outputs of the second I/Q cross product nonlinear lookup table circuit; and a second selection circuit coupled to receive respective delayed values of the Q data inputs output by the delay circuit that has a select output coupled to the second adder;

and wherein the first and second adders output filtered I and Q data, respectively, from the equalizer.

2. The equalizer of claim 1 wherein the in-phase and quadrature delay circuits each include seven delay elements that respectively delay I and Q input data by a predetermined delay time.

3. The equalizer of claim 2 wherein the delayed values of the I data inputs are coupled to an in-phase through dual tap nonlinear lookup table circuit comprising six first in-phase nonlinear lookup tables, and wherein the delayed values of the Q data inputs are coupled to a quadrature through dual tap nonlinear lookup table circuit comprising six first quadrature nonlinear lookup tables.

4. The equalizer of claim 2 wherein the in-phase delay circuit provides seven tapped delayed output signals (I7–I1) corresponding to delayed values of the I data input to the in-phase delay circuit, and wherein the quadrature delay circuit provides seven tapped delayed output signals (Q7–Q1) corresponding to delayed values of the Q data input to the quadrature delay circuit.

5. The equalizer of claim 1 wherein the first and second I/Q cross product nonlinear lookup table circuits each comprise two second combined in-phase and quadrature nonlinear lookup tables and four third combined in-phase and quadrature nonlinear lookup tables.

6. A programmable digital equalizer comprising:

in-phase and quadrature delay circuits that respectively delay in-phase (I) and quadrature (Q) input data by a predetermined delay time;

an in-phase through dual tap nonlinear lookup table circuit comprising a plurality of first in-phase nonlinear lookup tables for receiving delayed values of the I data inputs;

a quadrature through dual tap nonlinear lookup table circuit comprising a plurality of first quadrature nonlinear lookup tables for receiving delayed values of the Q data inputs;

an in-phase to quadrature cross dual tap nonlinear lookup table circuit comprising a plurality of first in-phase nonlinear lookup tables for receiving the delayed values of the I data inputs;

a quadrature to in-phase cross dual tap nonlinear lookup table circuit comprising a plurality of first in-phase nonlinear lookup tables for receiving the delayed values of the Q data inputs;

first and second I/Q cross product nonlinear lookup table circuits that respectively receive the delayed values of the I and Q data inputs from the in-phase and quadrature delay circuits;

a first adder for receiving outputs of the in-phase through dual tap nonlinear lookup table circuit, the quadrature to in-phase cross dual tap nonlinear lookup table circuit, and the first I/Q cross product nonlinear lookup table circuits;

a first selection circuit for receiving respective delayed values of the I data inputs output by the delay circuit and for outputting a select output to the first adder;

a second adder for receiving the outputs of the quadrature through dual tap nonlinear lookup table circuit, the in-phase to quadrature cross dual tap nonlinear lookup table circuit and the second I/Q cross product nonlinear lookup table circuit; and a second selection circuit for receiving respective delayed values of the Q data inputs output by the delay circuit and for outputting select output to the second adder;

and wherein the first and second adders output filtered I and Q data, respectively, from the equalizer.

7. The equalizer of claim 6 wherein the in-phase and quadrature delay circuits each include seven delay elements that respectively delay I and Q input data by a predetermined delay time.

8. The equalizer of claim 7 wherein the in-phase through dual tap nonlinear lookup table circuit comprises six first in-phase nonlinear lookup tables, and wherein the quadrature through dual tap nonlinear lookup table circuit comprises six first quadrature nonlinear lookup tables.

9. The equalizer of claim 7 wherein the in-phase delay circuit provides seven tapped delayed output signals (I7–I1) corresponding to delayed values of the I data input to the in-phase delay circuit, and wherein the quadrature delay circuit provides seven tapped delayed output signals (Q7–Q1) corresponding to delayed values of the Q data input to the quadrature delay circuit.

10. The equalizer of claim 6 wherein the first and second I/Q cross product nonlinear lookup table circuits each comprise two second combined in-phase and quadrature nonlinear lookup tables and four third combined in-phase and quadrature nonlinear lookup tables.

* * * * *